United States Patent [19]
Baker

[11] 3,962,644
[45] June 8, 1976

[54] CRYSTALLESS SCANNING RADIO RECEIVER CONTROLLED BY PROCESSING MEANS

[75] Inventor: William Baker, Oak Ridge, Tenn.

[73] Assignee: Tennelec, Inc., Oak Ridge, Tenn.

[22] Filed: May 30, 1975

[21] Appl. No.: 582,338

[52] U.S. Cl.............................. 325/470; 325/455; 325/459; 325/465
[51] Int. Cl.² ........................................ H04B 1/26
[58] Field of Search ........... 325/452, 453, 455, 459, 325/464, 465, 468, 470

[56] References Cited
UNITED STATES PATENTS

| | | | |
|---|---|---|---|
| 3,800,230 | 3/1974 | Marks et al. | 325/396 |
| 3,845,394 | 10/1974 | Hamada | 325/455 |

Primary Examiner—Robert L. Griffin
Assistant Examiner—Marc E. Bookbinder
Attorney, Agent, or Firm—Fitch, Even, Tabin & Luedeka

[57] ABSTRACT

A scanning FM monitor receiver is disclosed which is of the superheterodyne type and is capable of scanning and receiving a plurality of channels on a plurality of frequency bands. The receiver incorporates a phase-locked-loop frequency synthesizing means for generating beating signals for use in tuning specific channels and also incorporates processing means for controlling the frequency synthesizing means and the overall receiver operation. The processing means comprises a central processing unit, keyboard and display interface circuitry, general purpose input and output device and memory means. The receiver includes a keyboard and a display for viewing information during the operation of the receiver.

27 Claims, 9 Drawing Figures

CRYSTALLESS SCANNING RADIO RECEIVER CONTROLLED BY PROCESSING MEANS

This invention generally relates to signal-seeking receivers and, more particularly, to radio receivers which automatically sequentially scan a plurality of radio frequency channels.

Radio receivers which are capable of scanning a number of channels in one or more predetermined frequency bands are now well known. Such receivers permit the monitoring of several predetermined frequency channels because of the capability of sequentially scanning through predetermined channels and stopping on a particular channel in the event a radio frequency signal is present and is received on the channel at that time. Upon termination of the signal, which usually occurs in a relatively short time because the bands are used for communication by police, fire departments, and other departments, agencies and the like, the receiver resumes the scanning process to determine if other radio frequency channels are active. Many of the receivers in the prior art monitor certain selected channels by selectively introducing or switching one of a plurality of different crystals into the crystal oscillator tuning circuit. The crystal frequencies are preselected for the channels that are to be monitored and these crystals enable the superheterodyne receiver to generate the desired oscillator output beating signals for tuning the desired channel. Such receivers usually include circuitry that automatically sequentially switches the respective crystals into the tuning circuit of the oscillator, and may also have circuitry that activates a band switch in the event the receiver can receive channels in more than one band.

From the foregoing it should be apparent that the number of channels that a particular receiver of this type can monitor is a function of the number of crystals that can be switched into its oscillator tuning circuitry. Thus, if a dozen channels are to be scanned or monitored, it is necessary to provide a dozen different crystals in the receiver. In this regard, it may be necessary for a purchaser of a receiver to separately purchase each of the crystals and thereafter install them in the receiver. If, at a subsequent time, it is desired to monitor yet another frequency channel than was originally contemplated, it is necessary to replace an existing crystal with another crystal having the proper frequency of the new channel that is to be monitored.

Many of the apparent disadvantages of the above described type of scanning receiver have been eliminated by a scanning receiver that utilizes a frequency synthesizer to produce the beating frequencies for selecting the various channels which is the subject of a patent application of Peter W. Pflasterer, Ser. No. 450,983, filed Mar. 14, 1974, entitled "Crystalless Scanning Radio Receiver", which is assigned to the same assignee as the present invention.

While the above referenced crystalless scanning radio receiver offers significant advantages over the prior art radio receivers, the scanning receiver embodying the present invention has yet many additional desirable attributes and features that result in greater ease of operation, flexibility and expanded functional capabilities.

Accordingly, it is an object of the present invention to provide an improved crystalless scanning radio receiver that includes a processing means for controlling a frequency synthesizing means and the overall operation of the receiver.

Other objects and advantages will become apparent upon reading the following detailed description, while referring to the attached drawings in which.

Figure 1:
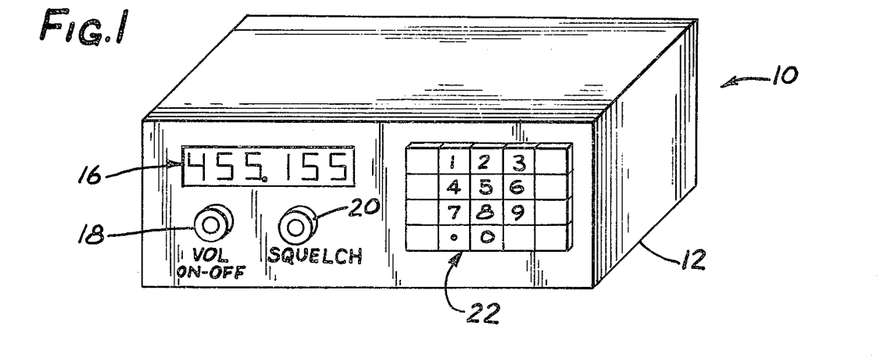
FIG. 1 is an isometric view illustrating the scanning receiver embodying the present invention.
Figure 2:
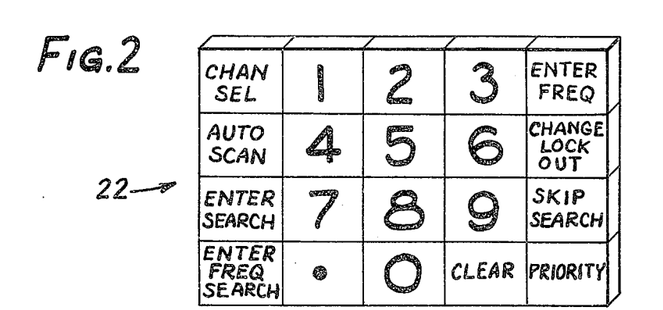
FIG. 2 is an enlarged view of a portion of a front panel of the receiver shown in FIG. 1, and particularly illustrating the keyboard thereof.

Turning now to the drawings, and particularly FIGS. 1 and 2, the scanning radio receiver embodying the present invention will be broadly described with respect to its general operation. The receiver, indicated generally at 10, has an enclosure 12 with a front face 14 that has a visual display 16 in the upper left corner thereof, a volume-on-off control knob 18 and a squelch control knob 20 located beneath the display 16. A keyboard, indicated generally at 22, occupies a substantial portion of the right side of the front face of the receiver. An enlarged view of the keyboard is shown in FIG. 2 and includes indicia illustrated on all of the keys, some of which indicia was omitted from the proportionately smaller illustration of the keyboard shown in FIG. 1.

Broadly stated, the scanning receiver embodying the present invention is adapted to operate in a number of different operational modes and has substantial flexibility in its operation due to a number of unique features that are incorporated into its design. An operator can easily display and load a specific frequency that is to be monitored by actuating or pressing the numerical keys of the keyboard in the proper order, including the decimal point and then press the appropriate function key. For example, assuming the operator wished to monitor a frequency of 455.155 megaHertz (MHz) he merely enters that number by pressing the numerical keys on the keyboard 22 and the numbers are displayed in the display 16 as they are entered. After all significant digits of the frequency are entered, i.e., all six digits are entered for the example being described, the ENTER FREQ. key is pressed which loads this frequency into one of the channels of the receiver. With respect to the entry of the significant digits, the loading and trailing zeros need not be entered. Other frequencies may be similarly entered and loaded until the maximum capacity of the receiver is reached, which is preferably about 16 channels, although a greater or lesser number of channels may be provided. When the operator turns the receiver on by manipulating the knob 18, the receiver will go into an automatic scan mode of operation (AUTO SCAN) where it sequences or scans through the channels that have a frequency loaded therein. It automatically sequences from channel to channel and stops on an active channel, i.e., a radio frequency transmission is received on the channel that is selected. The receiver will stop sequencing and receive the transmission until it terminates, in which case the receiver resumes the scanning of the channels until another active channel is located. It should be understood that the frequencies that are generally monitored are those relating to police, fire, mobile transceivers, mobile telephones and similar transmissions and communications which are usually of relatively short duration, as opposed to the generally continuous broadcast transmission of commercial radio stations. Thus, the aspect of resuming the sequential scanning of the channels may often result in the relatively rapid changing of one channel to another. In the event that a few channels are of immediate interest to the user, some of the channels may be provided with a priority status and it may also be desirable to temporarily lock out the channels of lesser interest, both modes of which will be more comprehensively described hereinafter.

Referring to the enlarged view of the keyboard shown in FIG. 2, the following more detailed description of the operation of the receiver of the present invention will be described in connection with the specific function keys that are shown thereon.

With respect to the keyboard 22 shown in FIG. 2, it comprises a total of 20 keys which are arranged in a 4 by 5 key matrix and includes 10 numerical keys as well as the decimal point key. Additionally, keys which determine operating function are also included, particularly a CHANNEL SELECT key, an AUTO SCAN key, an ENTER SEARCH key, a CHANGE LOCK OUT key, and ENTER FREQ key, an ENTER FREQ SEARCH, a SKIP key, a PRIORITY key and a CLEAR key. Additional functions may be performed by using numerical codes.

When the receiver is turned on, it automatically enters the AUTO SCAN mode wherein it sequentially scans or cycles through all channels that have been loaded with a frequency and which have not been locked out. During this mode of operation, the channel numbers, i.e., the numbers 0 through 15, sequentially appear in the display 16 which preferably comprises six digits of seven segment lighted display, preferably light emitting diodes, although other types of display may be used, such as nixie tubes or the like. The channel numbers preferably appear on the left side of the six digit display so that as the receiver sequentially scans through the channels, the channel numbers appear in the display and will rapidly cycle through the 16 channel numbers, until an active channel is located. When a signal is received, the display preferably alternately flashes the channel number and the frequency of the channel at approximately 1 second intervals. When the signal transmission terminates, the display 16 again flashes only the channel numbers as it sequences through them until another active channel is tuned. The scanning speed is preferably about 10 channels per second, although a faster or slower speed may be utilized, if desired. In the AUTO SCAN mode, all keys on the keyboard 22 are inoperative except for the CHANNEL SELECT key which may be pressed to exit the AUTO SCAN mode and enter the CHANNEL SELECT mode.

When the CHANNEL SELECT key is pressed, the scanning process is terminated and the channel number and its associated frequency are alternately displayed at the approximately one second intervals as was the case when a signal was being received when the receiver was in the AUTO SCAN mode. Successive closures of CHANNEL SELECT key causes the receiver to move to the next higher channel number so that the channels can be manually sequenced or any channel can be selected for the purpose performing other functions regarding that channel. For example, the CHANGE LOCK OUT key located on the keyboard 22 adjacent the number 6 key is adapted to preclude or lock out a channel from being automatically scanned during the AUTO SCAN mode. Thus, if an active channel is locked out, the receiver does not stop to receive the transmission during sequencing while in the AUTO SCAN mode.

During the CHANNEL SELECT mode of operation, it is preferred that the letter L be displayed preferably in the right hand side when the channel number is displayed (or the left side) in the event that the channel has been locked out. When the receiver is in the CHANNEL SELECT mode, all channels will be received whether or not they have been locked out. During the manual operation while in the CHANNEL SELECT mode, any of the channels will be received in the event that they are active even though the letter L is displayed for certain channels, indicating they have been locked out. Thus, the lock out function merely removes the channel from being automatically scanned when the receiver is in the AUTO SCAN mode. To return the receiver to the AUTO SCAN mode from the CHANNEL SELECT mode, it is only necessary to press the AUTO SCAN key on the keyboard 22. It should also be understood that when the receiver is in the CHANNEL SELECT mode, the operator may change the LOCK OUT status of any of the channels by merely pressing the CHANGE LOCK OUT key while the channel is being displayed and its status will be changed from the lock out to not locked out status or the converse.

When the receiver is placed in the CHANNEL SELECT mode by pressing the CHANNEL SELECT key, the entire keyboard 22 is activated. To enter a frequency into a particular available channel, the operator presses the proper sequence of numerical keys representing the frequency including the decimal point, followed by pressing the ENTER FREQ. key which loads the frequency into the memory of the receiver. When the first numerical key is pressed, the normal action of the CHANNEL SELECT mode is terminated the receiver goes to the DATA ENTRY mode and the display is blanked. Each number is then displayed as it is entered by the keyboard. If the operator makes an error in entering the frequency, it is only necessary to press the CLEAR key and the entire display is immediately cleared. The system remains in the DATA ENTRY mode when the keyboard is cleared so that the operator may again attempt to enter the correct frequency by pressing the appropriate numerical keys. If the operator is satisfied that the number entered is correct, he may then load that frequency into the memory of the receiver by pressing the ENTER FREQ key on the keyboard. It is also noted that if the number that is displayed is attempted to be loaded into the receiver by pressing the ENTER FREQ key, and frequency that was previously loaded into that particular channel in the memory will be replaced by the new frequency. Also, as soon as the ENTER FREQ key is pressed, the receiver is returned to the CHANNEL SELECT mode of operation. As will be described hereinafter, the frequencies that can be received by the receiver may be located in one of a number of bands, each of which have predetermined bandwidths. In the event that a frequency that is entered by the keyboard and displayed is outside of the limits of the bandwidth of the bands that are capable of being received, an attempt to load the frequency by pressing of the ENTER FREQ key will result in an E (for error) being displayed in the display 22, preferably on the right hand side of the display. The receiver remains in the DATA ENTRY mode when the error signal appears on the display and any other number may be entered from the keyboard in the manner previously described. The operator may return the receiver to the AUTO SCAN load at any time, regardless of what is being displayed, by merely pressing the AUTO SCAN key.

The scanning receiver embodying the present invention will now be described in connection with the block diagram of FIG. 4 which illustrates the circuitry of the entire receiver. The receiver is adapted to monitor the preselected channels within three separate bands; namely, a low band having a frequency range of about 30 to about 50 MHz, a high band having a frequency range of about 150 to about 170 MHz and a UHF band having a frequency range of about 450 to about 470 MHz. Additionally, other bands may be included therein, particularly a band having a frequency range of about 490 to about 508 MHz. Since the bandwidth of each of the bands is approximately 20 MHz, a 20 MHz range of beating signals that are applied to the RF mixers of the individual bands can be generated from a common source to selectively tune any channel in any of the bands. In this regard, a frequency synthesizer is utilized to generate the beating signals that are applied to the RF mixers of each of the bands. Moreover, the frequency synthesizer as well as the selective switching of other components of the receiver are controlled by a microprocesser arrangement which will be more fully described hereinafter.

Figure 4:
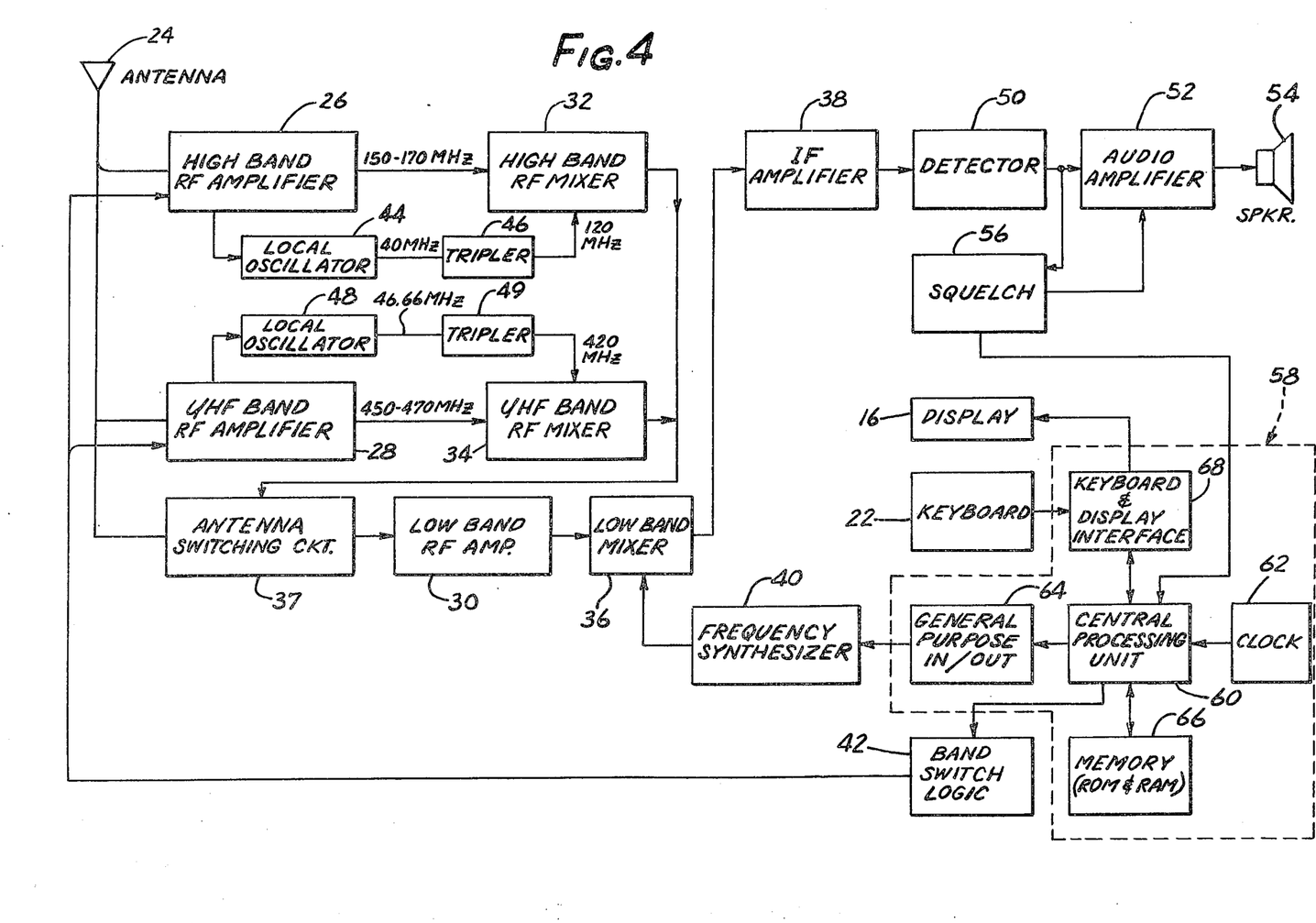
FIG. 4 is a block diagram of the electrical circuitry of the receiver embodying the present invention.

Turning now to the drawings, and particularly FIG. 4, an electrical block diagram of the scanning receiver embodying the present invention is shown to include a single antenna 24 that is adapted to receive signals within all of the bands the receiver is capable of receiving and the received signals are applied to the RF amplifiers. More specifically, signals having a frequency of about 150–170 MHz are fed to the high band RF amplifier 26, signals of 450–470 MHz are applied to the UHF band RF amplifier 28 and signals of 30–50 MHz are applied to the low band RF amplifier 30. It should be understood that while the specific arrangement utilizes a single antenna 24, a separate antenna for each band may be utilized, if desired.

Each of the RF bands has its respective amplifier connected to a RF mixer, i.e., the high band RF amplifier 26 is connected to a high band RF mixer 32, the UHF band RF amplifier to a UHF band RF mixer 34 and the low band RF amplifier to a low band RF mixer 36 through an antenna switching circuit 37. The output of the low band RF mixer is a signal having a frequency of 10.7 MHz, which is applied to an IF amplifier 38.

A frequency synthesizer 40 is used to generate selected output frequencies which vary in 5 kilohertz (kHz) increments within the range of about 19.3 MHz to about 39.3 MHz. Since the 20 MHz range is identical for all three bands, it is convenient to convert the higher frequency signals down to the frequency of the low band, i.e., 30–50 MHz, so that the output of a frequency synthesizer 40 can be fed to a low band RF mixer 36 and produce the desired output signal of 10.7 MHz which provides the input to the IF amplifier 38. Since the output frequencies of the frequency synthesizer 40 vary in 5 kHz steps within the range of 19.3 to 39.3 MHz, the conversion of the high UHF band frequencies down to the 30–50 MHz range enables the frequency synthesizer to provide the beating signals that are applied to the RF mixers regardless of the band from which the particular signal originates.

To identify the proper frequency, it is necessary to identify the band, as well as the output frequency of the frequency synthesizer 40 and, accordingly, a band switching logic circuit 42 is provided and is connected to the amplifiers 26 and 28 for the high and UHF bands and to the antenna switching circuit 37 for switching the antenna 24 to the low band amplifier 30 which remains on. Unlike the low band amplifier 30, however, the high and UHF band amplifiers 26 and 28 are only on when channels having frequencies within those bands are being received. Thus, for a particular channel that is to be monitored, the band switching logic circuit 42 energizes one of the amplifiers 26 or 28 if the channel was in either of these bands, and also operates the antenna switching circuit 37 to switch either the antenna 24 for receiving a low band frequency or one of the outputs from the high or UHF band circuits.

In this regard, the high band amplifier 26 is connected to the high band mixer 32, the output of which is connected to the antenna switching circuit 37. Similarly, the UHF band amplifier 28 is connected to a UHF band mixer 34, and its output is also connected to the antenna switching circuit 37. The mixers 32 and 34 are operable to reduce or convert the higher frequencies signals to the 30–50 MHz range by superheterodyning the received signal against another signal that is generated by a local oscillator. To this end, and referring to the circuitry associated with the high frequency band, a local oscillator 44 having a 40 MHz crystal driven by the amplifier 26 so that when the amplifier is powered, the local oscillator 44 will operate. Its output is tripled by a frequency tripler 46, producing a 120 MHz signal that is few to the mixer 32 which produces an output that is a difference signal with a frequency of 30–50 MHz.

Similarly, the UHF band includes a local oscillator 48 which includes a crystal for generating a 46.666 MHz signal which is fed to a tripler circuit 49 which twice triples the 46.666 MHz signal to provide a 420 MHz output signal that is fed to the UHF band mixer 34 yielding a difference signal of 30–50 MHz. The local oscillator 48 is powered when the UHF band amplifier 28 is powered and neither the high or UHF band amplifiers are powered when the band switch logic circuit 42 switches the antenna switching circuit 37 so that the antenna 24 is switched to receive a low band signal. Conversely, when either the high or UHF band amplifiers 26 or 28 is energized by the band switching logic circuit 42, the antenna switching circuit 37 connects the output from one of the mixers 32 or 34 to the low band amplifier 22. In this manner, the channels within only one band may be received at any one time. Moreover, the band switching logic circuit 42 is controlled by a processing means as will be described herein.

The output of the IF amplifier 38 is applied to a detector 50 which may be a conventional circuit operating in the usual manner to produce an audio signal. The audio signal is preferably applied to an audio amplifier 52 to drive a speaker 54. The output of the detector 50 is also applied to a squelch circuit 56 which operates in a conventional manner to produce a positive indicating or control signal when the audio signal is being received from the detector 50 and preferably produces a logical "0" control signal when the audio signal from the detector 50 becomes quite small, indicating that a channel is not being received. The squelch control signal is applied to the audio amplifier 52 to turn it off when no signal is being received. This may be achieved using well known circuitry to prevent the audio amplifier 52 from responding to noise. The squelch control signal is also applied to a central processing unit 60 which forms a part of a processing means 58, commonly referred to as a microprocessor, so that the information concerning whether a frequency channel is being received or not can be utilized to control the scanning and other functions during operation of the receiver.

The processing means 58 includes a clock 62, a general purpose input-output device 64, memory means 66 which can include both random access memory (RAM) and read only memory (ROM) and a keyboard and display interface 68 in addition to the central processing unit 60. As the name implies, the keyboard and display interface circuitry 68 connects the central processing unit 60 with the display 16 and with the keyboard 22. The general prupose input-output device 64 is interconnected with the frequency synthesizer 40 to control the generation of the beating signals that are used to select the channels in any and all of the various bands. The control processing unit 60 controls the band switching logic circuitry 42 which is used to activate or energize the amplifiers and mixers that are associated with a channel that is located in one of the bands. In this regard, if a signal is within the high or UHF band, then it is desirable that only the RF amplifier and RF mixer for the correct band be energized. The band switching logic 42 selectively energizes the RF amplifiers, which in turn power the associated RF mixers local oscillators and frequency multipliers when the amplifiers are energized. However, the low band RF amplifier 30 and the low band RF mixer 36 are always energized, as previously described. When the frequency synthesizer produces a signal of the proper frequency, it is applied to the low band RF mixer to yield the 10.7 MHz signal for application to the IF amplifier 38 and the channel will be received. The presence of a signal causes the detector 50 to provide an indication to the squelch circuit 56 which energizes the audio amplifier 52 and also provides a signal to the microprocessor 58 to stop the sequential scanning function so that the operator can listen to the transmission. Once the transmission signal terminates, the receiver will resume the sequential scanning or other function depending upon the mode of operation in which the receiver is operating.

Figures 5, 8:
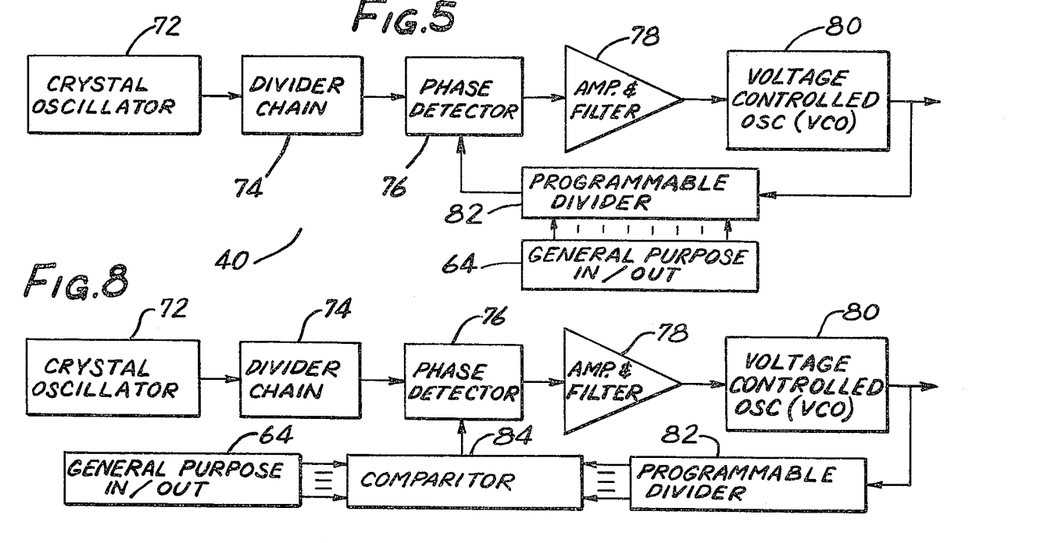
FIG. 5 is a block diagram of a portion of the present invention and specifically illustrating the frequency synthesizing means and its interconnection with the processing means that is incorporated into the receiver of the present invention.
FIG. 8 is a block diagram illustrating an alternative arrangement for interconnecting the frequency synthesizing means and the processing means embodying the present invention.

Referring generally to the frequency synthesizer 40, which is shown in more detail in the block diagram of FIG. 5, it is of generally conventional design and utilizes a programmable divider within a phase-locked-loop. More specifically, it comprises a crystal oscillator 72 which generates a standard reference frequency which is fed to a divider chain 74, the output of which is applied to a phase detector 76. The output of the phase detector 76 is fed to an amplifier and filter 78 and then to a voltage controlled oscillator 80 (VCO) which provides the output that is applied to the low band RF mixer 36 shown in FIG. 4. The output of the voltage controlled oscillator 80 is also sampled by a programmable divider 82 which has a plurality of binary inputs, preferably 12, that are controlled by the microprocessor 58 and connected to the general purpose input-output device 64 thereof. The input-output device 64 loads the programmable divider upon command with a number and the voltage controlled oscillator causes the divider to count (either up or down) to a point at which the divider overflows. When the overflow occurs, an output is presented to the phase comparator and also back to the divider itself which causes the general purpose input-output device to reload the number again.

A modification of the receiver is shown in FIG. 8 which is similar to the arrangement shown in FIG. 5 but includes a comparator 84 which is used to compare the count from the voltage controlled oscillator with a computed binary number representing the desired frequency that is produced in the microprocessor 58 and which is applied to the comparator by the general purpose input-output device 64 so that when a comparison reaches the full count an output pulse is transmitted to the phase detector or comparator 76. With respect to the operation of the synthesizer, the phase detector or discriminator 76 compares the phase of the comparator output 84 with the phase of the reference frequency from the divider chain 74 and produces an output voltage that is proportional to the phase difference between the comparator output and the reference frequency, which voltage is used as an error signal to control the voltage controlled oscillator frequency.

Figure 9:
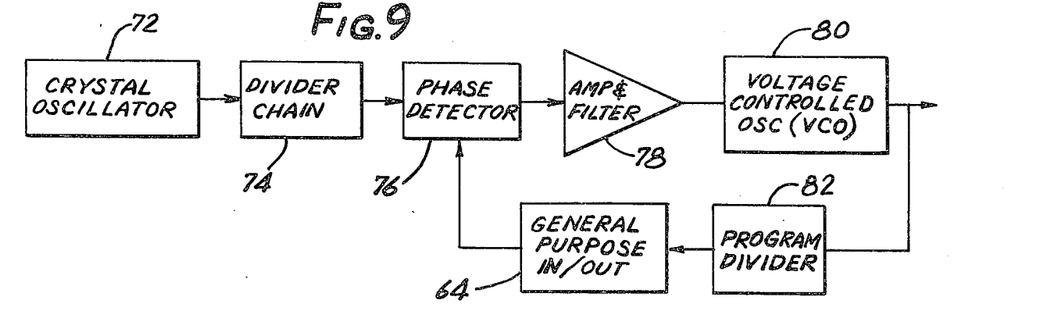
FIG. 9 is a block diagram illustrating an alternative arrangement for interfacing the frequency synthesizing means and the processing means that is incorporated into the receiver embodying the present invention.

Another modification of the receiver embodying the present invention is shown in FIG. 9 to include a crystal oscillator 72, divider chain 74, phase detector 76, amplifier and filter 78 and voltage control oscillator 80, together with a divider 82 and the general purpose input-output device 64 having its output connected to the phase detector 76. In this arrangement, the microprocessor 58 performs the entire programmable divider function for the frequency synthesizer and eliminates the need for the comparator 84 as illustrated in FIG. 5. The microprocessor must be compatible from the standpoint of speed for this arrangement, i.e., it is necessary for the input-output device to be fast enough to handle the programmable divider function in total. The arrangement shown in FIG. 5 has the programmable divider function controlling the frequency synthesizer externally of the microprocessor while the arrangement of FIG. 8 has this function performed entirely within the microprocessor. A third alternative, while not specifically shown, would accomplish the programmable divider function partially within the microprocessor and partially outside of it.

Turning now to the microprocessor portion of the scanning receiver embodying the present invention and, as previously mentioned, it includes the central processing unit 60, clock 62, the general purpose input-output device 64 memory 66 and the keyboard and display interface 68. Moreover, a compatible display 16 and keyboard 22 enable the operator to program or load the receiver with frequencies of channels and view the display to obtain a visual indication of the mode of operation as well as more detailed operation of the receiver at a particular time. While such microprocessor components can be obtained from various sources, the receiver embodying the present invention utilizes the PPS-4 system that is manufactured by Rockwell International, Microelectronics Division, Anaheim, Calif. and includes the following components: a central processor unit, component no. 10660; a general purpose interface input-output device, component no. 10696; a keyboard and display interface component no. 10788, a system clock component no. 10706 and a memory unit having random access memory (RAM) and read only memory (ROM) component no. A07. Moreover, the operation of the microprocessor including these specific components is described in the Rockwell PPS-4 Microcomputer Programming Manual which describes the manner of operation of the system and specifically includes electrical block diagrams for the specific componenets. More specifically, the block diagrams of the general purpose input-output device is shown in FIG. 14 thereof, and the output pin configuration and the instruction format are illustrated in FIGS. 14 and 15. The block diagram of the general purpose keyboard and display interface is shown in FIG. 2 therein and the central processing unit block diagram including RAM and ROM memory is shown in FIG. 2.2. The timing diagram for the system is shown in FIG. A.1 which illustrates the four-phase operation of the system during each clock cycle and the manner in which information is processed and transmitted. The above mentioned drawings from the Instruction Manual are specifically incorporated by reference herein. It should be understood that while the specific microprocessor 58 illustrated and described herein has a total of four components, (excluding the display, keyboard and clock) the functions may be performed by a system having a greater or fewer number of components, depending upon the particular design.

Figure 3:
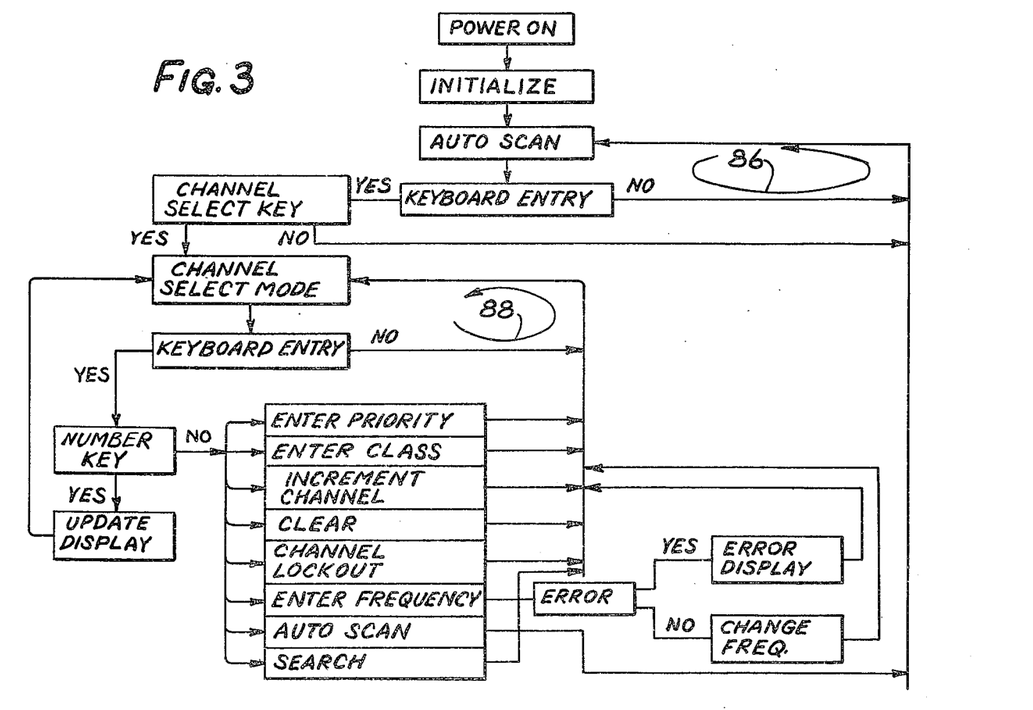
FIG. 3 is an algorithm illustrating the logic flow diagram of the operation of the processing means of the present invention.

Turning now to FIG. 3, which illustrates the algorithim of the operation of the microprocessor 58 with its associated keyboard and display, when the receiver is turned on by rotating the switch or knob 18, the receiver goes into an initializing mode wherein a series of instructions are carried out in a subroutine and automatically falls into an AUTO SCAN mode of operation where, as previously mentioned, the receiver scans through the programmed channels, i.e., those channels which have a frequency loaded therein and which have not been locked out. If a channel that is tuned is broadcasting, the receiver will stop the sequential scanning and provide the audio output as long as the channel is active, i.e., a broadcast signal is received. Upon termination of the broadcast transmission, the receiver will resume its scanning function until it detects another active channel. Returning to the algorithim shown in FIG. 3, movement continues through the keyboard entry block as shown by the arrow 86, which means that if no keyboard entry is made on the keyboard 22, the receiver will remain in the AUTO SCAN mode. As it skips through the preprogrammed and non-locked out channels, it will go into a RECEIVE mode as soon as it tunes an active channel, i.e., one that is receiving a signal. Upon termination of the signal, it will resume the AUTO SCAN mode of operation until another active channel is located or until a keyboard entry is made.

Figure 6:
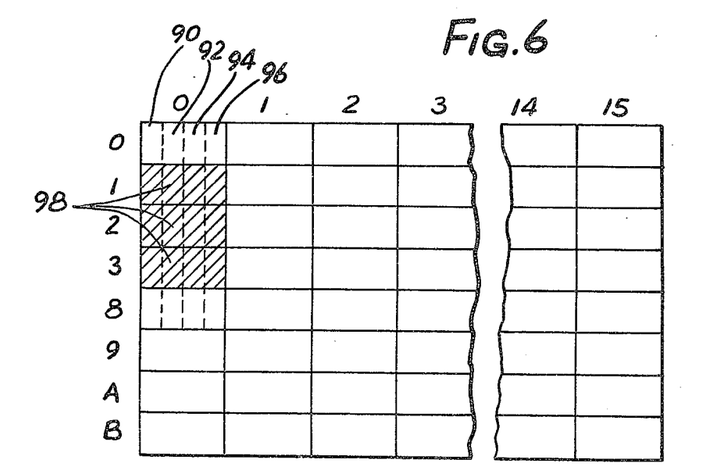
FIG. 6 is a diagrammatic representation of the matrix of a portion of the memory means in which information is stored.

To provide a better understanding of the manner in which the scanner cycles through the preferably 16 preprogrammed channels, reference is made to FIG. 6 which illustrates a matrix of rows and columns (with portions removed) of the random access memory portion of the memory 66 in which the channels are located. More specifically, the "map" of the RAM is shown to include 16 channels, numbered 0 through 15, above adjacent respective columns. There are also a number of rows with each of the matrix coordinates, e.g., row 0, column 0 having four bits of information which are shown to be separated by the dotted lines therein. As the receiver cycles through the channels during the AUTO SCAN mode of operation, it analyzes the information located in each of the channels. Referring to the representative channel identified by column 0, the first bit 90 indicates whether a frequency is presently loaded in the channel. The second bit 92 preferably provides information whether a channel is locked out or not and bits 94 and 96 preferably identify the band that the channel is in, i.e., whether it is a UHF, high or low band channel so as to properly actuate the band switching logic circuitry 42 as previously described. In the next three rows numbered 1, 2 and 3, there are 12 bits 98 of binary information which identifies the number of the frequency that is located therein. Row 8 can be used for priority information for the channel if desired. The remaining coordinates in rows 9, A and B may be used for operational instructions not related to the channel itself. Thus, as the receiver sequences through the various channels, the information in the various channel locations of the random access memory is read and the channel information is loaded into the central processing unit 60 and then to the general purpose input-output device for application to the synthesizer 40 if certain conditions are satisfied. For example, the first bit 90 will indicate whether there is a frequency loaded in the particular channel, the second bit 92 will not if it is locked out or not and bits 94 and 96 provide band identification. The bits in rows 1, 2 and 3 identify the frequency that is loaded therein and row 8 may provide priority information. It should be apparent that if the information bit 90 indicates that there is no frequency loaded into the channel location, the central processor unit will immediately skip to the next channel and begin to read the information therein. Similarly, if the channel is loaded but is also locked out, (indicated by bit 92) the central processing unit will go to the next channel location.

Returning to FIG. 3, in the event that a keyboard entry is made, it is then determined whether the CHANNEL SELECT key was pressed. If a key other than the CHANNEL SELECT key was pressed, then the receiver returns to the AUTO SCAN mode of operation. If the CHANNEL SELECT key was pressed, the receiver is placed into the CHANNEL SELECT mode of operation. As previously mentioned, when the receiver is in the CHANNEL SELECT mode, the channels are sequenced manually, i.e., successive channels are tuned in response to successive pressing of the CHANNEL SELECT key. Also, the keyboard is activated when the receiver is in the CHANNEL SELECT mode. If no keyboard entry is made, then the processor 58 follows the loop shown by the arrow 88 until a keyboard entry is made. If a keyboard entry is made, the processor 58 determines whether a number key has been pressed and if so, places the receiver into the DISPLAY UPDATE mode, which causes the display to illuminate the numbers as they are pressed on the keyboard. Every time a new number key is pressed, it is illustrated in the display until a new frequency is entered. At that time, either the ENTER SEARCH key, the ENTER FREQUENCY key or the AUTO SCAN key can be pressed by the operator which returns the receiver to the AUTO SCAN mode of operation. If the ENTER FREQUENCY key is pressed, then an error analysis is made to determine if the frequency that was entered into the display was one that is accepted by the receiver. If an error occurs, then the letter E is displayed and the receiver is placed into the channel select mode. If there is no error, then the frequency will be changed. It should also be noted from the algorithm shown in FIG. 3 that after a keyboard entry is made and it is determined that no number key has been pressed, then any of the following function keys may be pressed i.e., PRIORITY, CHANNEL SELECT, CLEAR, CHANGE LOCK OUT, ENTER FREQUENCY, AUTO SCAN, AND ENTER SEARCH.

With respect to the operation of the scanning receiver when it is in the SEARCH mode of operation, after a frequency has been entered into the display, the ENTER SEARCH key is pressed which causes the frequency synthesizer to increment through a plurality of possible frequencies in 5 KHz steps, and preferably about 256 frequency steps, looking for an active frequency. It will increment through the frequencies until an active frequency is located which may or may not be a frequency that is loaded in one of the channel locations in the random access memory. Once an active channel is located, the sequencing terminates and the display illustrates the frequency of the transmission being received, as well as whether an available channel is present in the random access memory. In the event a channel is available, the operator can then press the ENTER FREQUENCY-SEARCH key and load the frequency in the available channel of the memory. If it is not desired to load the frequency into memory, the SKIP key can be pressed, which resumes the sequencing through the possible frequencies. If it is desired to leave the SEARCH mode of operation, the AUTO SCAN key may be pressed to place the receiver back into the AUTO SCAN mode of operation.

With respect to the PRIORITY function, and recalling that bits in row 8 of each of the channels of the RAM map were used for priority information, it is possible to give any of the channels a priority designation which will cause the receiver to sequentially scan through the channels during the AUTO SCAN mode of operation and only stop at priority channels if they are active, and to pass over non-priority active channels in the event they are present. Thus, upon termination of the transmission on any channel which causes the receiver to resume the AUTO SCAN mode of operation, it will pass over non-priority active channel and first tune priority active channels. In the event that a priority channel becomes inactive so as to cause the resumption of the sequential scanning, another priority channel will be tuned before the receiver will stop on a non-priority channel that is active. In this way, the receiver will always stop on an active priority channel before it stops on an active non-priority channel.

In accordance with another aspect of the present invention, priority classes may also be established, i.e., various channels having frequencies used by fire departments, police departments, civil defense or other similar classifications can be grouped so that the scanner will sequence through a specific class of channels searching for an active channel within that class before it will stop an active channel that is not within the class. In this manner, the channels of interest can be more closely monitored.

With respect to the operation of the scanning receiver embodying the present invention and utilizing the specific microprocessor components, the manufacturer numbers of which are set forth hereinabove, the hexadecimal machine language that implements the functional descriptions that have been described herein is shown in Table I below.

The functional routines and subroutines of instructions that carry out the functional operations that have been described herein are listed in Table I and include the following; initialize, automatic scanning, channel select, increment channel, clear, lockout, enter frequency, enter search, skip, enter frequency from search mode of operation, exit search, error analysis and display, binary to seven segment display, decimal to binary conversion for use by the frequency synthesizer and binary to decimal conversion for use by the frequency synthesizer. The machine language in Table I is in the order of the columns as they are numbered.

Many of the specific circuits previously described with respect to the block diagram of FIG. 4 are well known and of conventional design, and for that reason a detailed explanation of these circuits is not included herein. Thus, a detailed description of the circuit components and the operation of the RF amplifiers, the frequency multipliers, the mixers and oscillators and the like are not included. Moreover, the detailed circuitry shown in FIG. 7 also includes several integrated circuits that are illustrated in block form rather than showing the detailed circuitry that is contained therein.

TABLE I

| Column 1 | Column 2 | Column 3 | Column 4 |
|---|---|---|---|
| 0000L049F | | | |
| 25 00 FF D0 37 6B 88 D1 | 7F 3F B1 00 00 7E 3C 79 | 52 80 00 6C 78 2F 76 2F | 1F BB BE 3D 17 B7 52 00 |
| 17 83 83 03 80 17 83 83 | 3F 00 6F 7F 3F 26 D8 50 | 7D 2F 7E 3D 7D 3F 52 80 | 00 68 7F 3F 22 03 08 03 |
| 26 3F 00 67 37 1B 00 FF | 80 00 67 37 1D 81 00 00 | 00 6E 7A 2F 7E 3D 7D 3F | 0A 00 67 37 00 EF 02 B2 |
| 19 7B 0D 00 68 1E A4 7E | 90 94 98 9C A0 A4 A8 AC | 52 80 00 6A 7F 2F 77 2F | 7F 1B 02 A8 12 6E 91 03 |
| 3C 79 3F A8 7F 3C 7F 3F | AE B0 B2 B4 B6 B8 BA BC | 7E 2F 7E 3F 05 00 6A 20 | 0A 00 67 37 00 DF 02 B2 |
| 1A D8 14 AE 50 86 50 80 | 70 3C 79 BE 79 3C 7F BE | 34 0E 08 65 2C B8 05 00 | 02 A8 03 F7 7F 53 E7 00 |
| 6E B4 50 32 6E B8 50 36 | 72 3C 7A BE 70 3C 7E BE | 16 84 53 DA 02 75 89 00 | 00 03 0A 00 67 37 00 CF |
| 6E BC 50 3A 50 86 00 00 | 79 3C 7C BE 74 3C 7C BE | 83 24 00 5A 37 69 08 65 | 02 B2 02 A8 03 F7 74 53 |
| 00 57 3F 1C 9C 0E 17 3F | 7C 3C 78 BE 53 2B 53 2F | 2F 8C 00 5B 37 2F 95 00 | EF 00 00 02 6A 53 C0 00 |
| 74 0F 0E 1E 8E 8F A7 37 | 53 33 53 10 53 14 53 18 | 5C 36 2F 00 60 7F 2F 9D | 00 67 37 00 FF 19 7C 0D |
| 1F 0B 0E 6A A0 21 00 67 | 53 1C 53 20 53 24 05 00 | 7F 00 6A 3C 7D 3F 52 C0 | 60 94 60 96 60 98 00 68 |
| 37 00 FF 19 17 9E 54 30 | 00 4C 7F 2F 7F 2F 7C 2F | 00 6A 24 34 69 08 65 2C | 7E 3F 51 E0 52 40 52 48 |
| 14 A3 A9 50 A4 50 30 50 | 7F 3F 05 00 4C 24 70 0A | AB 05 19 37 00 6A 3F 79 | 52 60 00 68 37 1E A2 02 |
| E0 6D AE AC 53 75 6E B3 | 2F 8E 15 07 05 1C 9A 0E | 08 65 2F 7F 0A 3F 05 00 | A8 A4 02 75 26 54 90 1B |

TABLE I-continued

| Column 1 | Column 2 | Column 3 | Column 4 |
| --- | --- | --- | --- |
| 25 50 A4 6D A5 00 67 37 | 67 05 50 40 1C 2A 9F 67 | 7F 00 5A 04 19 75 1B 10 | 02 A8 12 6E A7 53 A9 1B |
| 00 FF 19 7B 0C 3F 51 20 | 05 07 00 6F 77 0B 3F 15 | 37 1B 7F 0C 1E 8F AF 00 | 02 A8 12 6E AF 53 BB 00 |
| D4 D3 81 D5 D6 A4 00 66 | AB 00 60 00 68 34 1C 9E | 6A 12 3C 7D 0C 1E 98 9A | 5A 7F 3C 2C B9 05 00 00 |
| 7F 3F 00 4E 7E 2F 7F 3F | 34 1C 9D 15 B9 1F 47 AD | 51 C0 75 00 6C 3F 24 00 | 00 67 37 00 FF 19 36 1D |
| D3 90 D5 D6 A4 00 66 37 | BB 1F AD 50 B0 00 00 00 | 6C 35 0A 2D A1 20 00 6A | 34 1C 27 36 1C 2D 37 1C |
| 6E 9B 9D 3F 8A 26 D8 50 | 7E 0C 1E 8C 7B 00 6C 2F | 71 0A 3F 7F 0C 1E 9E 00 | 2E 95 00 00 00 00 5A 34 |
| 86 00 00 86 14 A7 95 00 | 79 3F 52 DE 7F 0C 1E 91 | 5A 20 71 0A 3F 70 0C 1E | 19 65 19 03 00 3F 19 6A |
| 67 37 00 FF 19 50 08 00 | 93 54 40 77 00 6C 2F 71 | 80 54 40 00 00 00 00 00 | A1 40 A4 A6 19 97 00 67 |
| 16 B5 1C 93 05 22 51 A7 | 2F 7C 3F 52 DE 00 00 00 | 06 0E 6F 74 6F 71 6F 05 | 37 00 FF 19 37 51 00 00 |
| 00 00 00 00 00 00 00 00 | 00 5A 34 2C A2 00 5A 7F | 00 5A 00 6A 7F 2F 8C 05 | 11 00 67 3F 37 00 FF 19 |
| 00 78 7F 2F 82 26 D8 D5 | 2F 7D 2F 77 2F 77 2F 7F | 70 3C 79 A8 79 3C 7F A8 | 53 80 00 00 00 00 00 00 |
| 87 78 7F 2F 8A D8 50 CE | 2F 7A 3E 7C 3F 52 80 12 | 72 3C 7A A8 70 3C 7E A8 | 00 4F 73 0B 1B 00 67 37 |
| 95 00 A2 8B 80 95 9C 00 | 3F 00 4D 37 1B 54 40 40 | 79 3C 7C A8 74 3C 7C A8 | 00 FF 19 12 3F 00 4E 37 |
| A2 A7 0F 0F 0F 07 07 00 | 26 02 6A 8A 77 2F 7E 2F | 2C 51 54 71 3C 7F B7 70 | 1B 00 67 37 00 EF 19 12 |
| 14 A3 A5 50 A4 00 57 37 | 7E 3F 00 4D 7F 2F 8C 00 | 3C 78 B7 71 3C 7C B7 05 | 3F 00 4D 37 1B 00 67 37 |
| A9 66 AC AE 53 58 17 37 | 5F 7B 0C 1E 9F 76 00 5E | 00 00 00 80 C0 00 00 00 | 00 DF 19 12 3F 00 4C 37 |
| 62 B3 B5 53 40 00 68 7F | 0C 1E 9D 51 E0 52 48 7A | 6E 94 00 68 70 2F 85 00 | 1B 00 67 37 00 CF 19 12 |
| 2F B7 00 58 7F 2F BC 80 | 0C 1E A5 51 E0 7E 0C 1E | 58 79 2F 8A 00 78 7F 2F | 3F 53 80 00 00 00 00 00 |
| 1D 36 34 1C 27 36 1C 2D | B3 00 5E 7B 0C 1E B1 52 | 8F 26 24 D9 D5 94 00 00 | 00 00 00 00 00 00 00 00 |
| 37 1C 2E 11 1A 11 00 67 | 52 52 60 7F 0C 1E B9 52 | 00 68 2F 9A 00 58 2F 9E | 00 5A 37 1A 11 65 19 1A |
| 2F 7F 2F 91 00 58 7F 2F | 40 70 0C 1E 50 86 52 40 | 00 78 2F A2 00 56 37 1F | 2F 11 69 8C 19 4F 82 00 |
| 96 00 6C 1A 03 00 50 10 | 00 6E 7C 2F 7F 3F 52 80 | 0B 00 78 3F 36 03 00 26 | 50 34 03 00 2F 49 91 54 |
| 00 68 7E 0C 1E AD 7F 3C | 00 6E 7A 2F 7B 3D 7E 3F | 3F 24 D9 D5 B3 00 78 2D | 26 00 00 00 00 00 00 00 |

Figure 7:
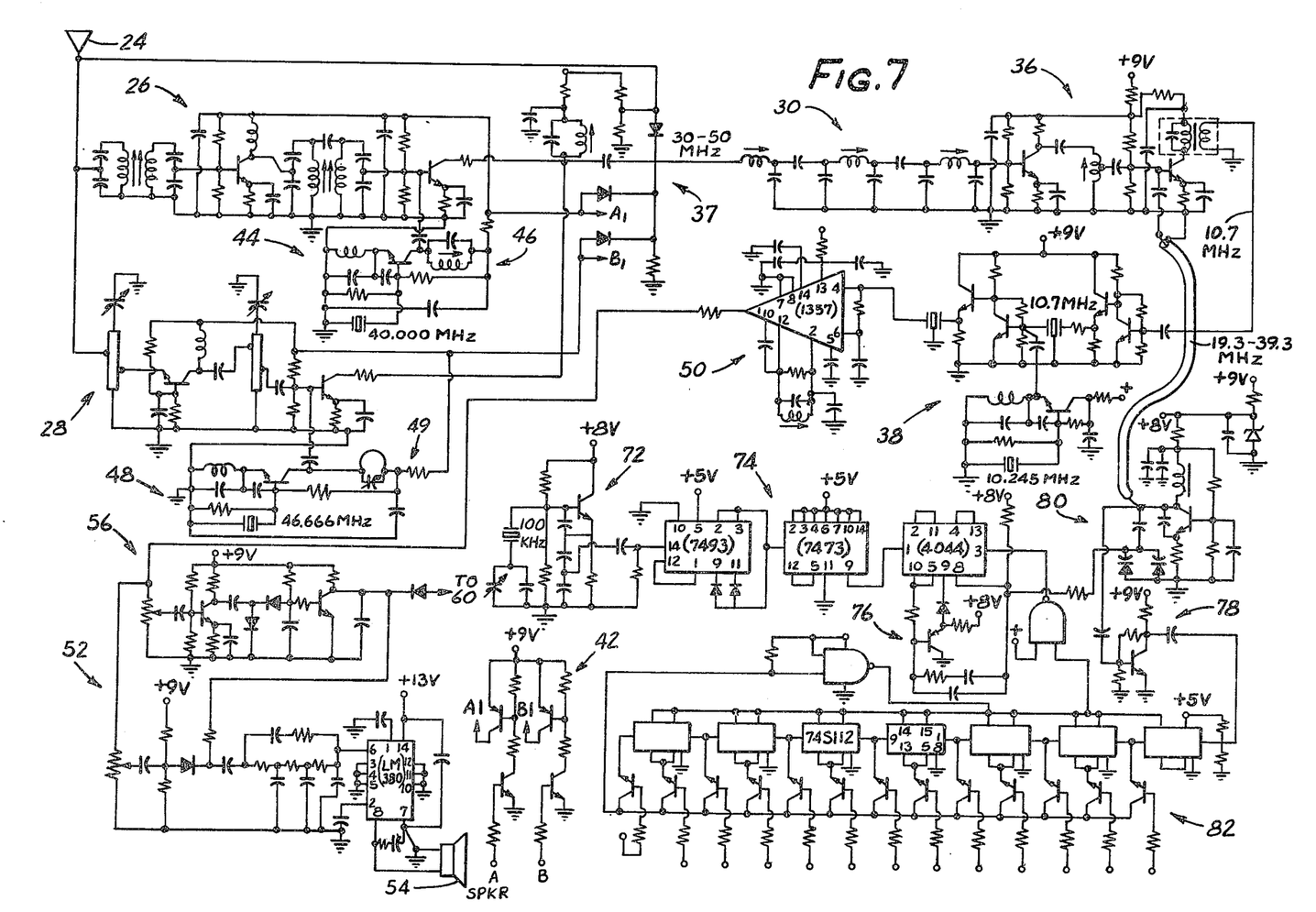
FIG. 7 is a detailed electrical schematic diagram of the receiver embodying the present invention.

However, the standard industry designation numbers are shown (in parentheses adjacent or inside the blocks), together with the pin numbers of the integrated circuits. The detailed circuits for these block diagrammatic representations are hereby incorporated by reference herein.

From the foregoing detailed description of the scanning receiver embodying the present invention, it should be understood that the many varied functional capabilities that have been described herein offer advantages and flexibility in the operation of the scanning receiver. It is of great significance that crystals need not be purchased and installed for monitoring a particular channel, inasmuch as all that is necessary is to know the frequency of the channel and, provided that it is a frequency that is within the limits of the bandwidth of one the various bands of the receiver, it can be easily loaded into one of the preferably 16 channels that are provided. In the event that all channels are previously loaded with a frequency, a new frequency can easily replace one of the existing frequencies by merely pressing the ENTER FREQUENCY key once the new frequency has been entered into the display. However, as has been described, it is not necessary that the operator know any of the frequencies, as they can be programmed by placing the receiver in the SEARCH mode of operation and merely let it sequence through 256 consecutive possible frequencies within the band until it engages an active channel, in which case the channel frequency will be displayed by the display 16. The ENTER FREQUENCY-SEARCH key may then be pressed to enter the frequency within the memory at that time. Moreover, the flexibility of the scanning receiver of the present invention permits class priority as well as individual priority channels to be established and also permits a channel to be locked out or temporarily removed from the sequential scanning during the AUTO SCAN mode without removing the frequency from the channel. Thus, the combination of the lock out feature and the priority feature would permit multi-level priority.

The receiver alternatingly illustrates the number of the channel, i.e., 0 through 15, and the frequency of the channel when it is received and, when the receiver is in the scanning mode, the channel numbers rapidly cycle through the display so that the operator can easily determine when the scanner is scanning. Moreover, by placing the receiver in the CHANNEL SELECT mode, he can manually sequence through the channels by pressing the CHANNEL SELECT key and receive an active channel even though it has been previously locked out. When the receiver is in its CHANNEL SELECT mode, the entire keyboard is activated, which is not the case when in the AUTO SCAN mode. This prohibits inadvertent pressing of keys while in the AUTO SCAN mode which could remove or alter important information in one or more of the memory locations which could conceivably cause a malfunction or unsatisfactory operation of the receiver.

It is of course understood that although preferred embodiments of the present invention have been illustrated and described, various modifications thereof will become apparent to those skilled in the art and, accordingly, the scope of the present invention should be defined only by the appended claims and equivalents thereof.

Various features of the invention are set forth in the following claims.

What is claimed is:

1. A signal seeking receiver for automatically scanning and monitoring a plurality of predetermined radio frequency channels located in one or more RF bands, and for selecting one channel having a radio frequency signal thereon, said receiver comprising:

an RF section for the RF band and including a RF amplifier and a RF mixer, said RF section providing an intermediate signal when a radio frequency signal is received on a channel;

an IF section operably connected to said RF band mixer and including an IF amplifier for amplifying the intermediate signal received from said RF section;

detector means for producing an audio signal when said intermediate signal is being received;

an audio amplifier connected to said detector means for driving an audio speaker with said audio signal;

means for disabling the audio amplifier when no audio signal is being received and for producing an indicating signal for application to a processing means when an audio signal be being received;

frequency synthesizing means for selectively generating beating signals of predetermined frequencies for application to said RF mixer to select a frequency and provide said intermediate signal, said frequency synthesizing means including a phase-locked-loop and being operable to provide said beating signals of preselected frequencies in response to various preselected input signals being applied thereto;

memory means for storing operating instructions for use by a processing means and for storing information for a plurality of channels;

processing means for controlling said frequency synthesizing means and for loading and retrieving information and instructions from said memory means, said processing means normally operating in a first mode wherein said various preselected input signals concerning said channels are retrieved from said memory means and are applied to said frequency synthesizing means whereby said channels are sequentially scanned, said scanning terminating on a specific channel in response to receiving said indicating signal, said processing means resuming the scanning of said channels in response to the termination of said indicating signal; and means operably connected to said procesing means for entering and loading instructions and frequency information for controlling the operation of said processing means.

2. A receiver as defined in claim 1 including display means operably connected to said processing means for selectively providing a visual readout of selected information concerning the operation of said receiver.

3. A receiver as defined in claim 2 wherein said display means provides a visual readout of selected channel, frequency and status information concerning the operation of said receiver.

4. A receiver as defined in claim 2 wherein said means operably connected to said processing means for entering and loading said instructions and frequency information comprises a keyboard means having a plurality of separate keys.

5. A receiver as defined in claim 1 wherein the radio frequency channels are located in two or more RF bands and further including band switching means for energizing said RF section when the channel being scanned is within its corresponding RF band.

6. A receiver as defined in claim 4 wherein said processing means is transferred into a second mode of operation in response to selective operation of said keyboard means, said processing means successively incrementing through said channels in response to successive selective actuation of said keyboard means.

7. A receiver as defined in claim 6 wherein said keyboard means includes a plurality of function and numerical keys, one of said function keys being adapted to transfer said processing means from said first to said second mode of operation.

8. A receiver as defined in claim 7 wherein said keyboard means is inoperative when said processing means is in said first mode, except for said key that affects transfer of said processing means from said first to said second mode of operation.

9. A receiver as defined in claim 8 wherein substantially all of said keys of said keyboard means are operative when said processing means is in said second mode of operation.

10. A receiver as defined in claim 6 wherein said display means provides a visual readout of the channel number during the sequential scanning, said display means alternatingly providing the channel number and signal frequency when a radio frequency signal is received on one of said selected channels.

11. A receiver as defined in claim 7 wherein said processing means is adapted to receive a lockout indication for any of said channels in response to actuation of a preselected function key while said processing means is in said second mode of operation.

12. A receiver as defined in claim 11 wherein said display means provides a visual indication of the lockout status of a channel during the sequential scanning when said processing means is in its first mode of operation.

13. A receiver as defined in claim 12 wherein said display means illustrates the letter L thereon when a channel is given a lockout status.

14. A receiver as defined in claim 11 wherein said processing means does not terminate on a specific channel in response to receiving said indicating signal in the event said processing means receives a lockout indication for said channel while said processing means is in said first mode of operation.

15. A receiver as defined in claim 11 wherein said memory means is adapted to store a lockout indication for each of said channels.

16. A receiver as defined in claim 1 wherein said memory means stores digital information for each of said channels, including information indicating the existence of a frequency loaded therein, the lockout status and the frequency thereof.

17. A receiver as defined in claim 16 wherein said memory further includes information relating to RF band identification.

18. A receiver as defined in claim 16 wherein said memory means further includes information relating to the priority status of said channels.

19. A receiver as defined in claim 6 wherein said processing means is adapted to receive a priority indication for any of said channels in response to actuation of a preselected key while said processing means is in second mode of operation.

20. A receiver as defined in claim 19 wherein said display means provides a visual indication of the priority status of a channel during the sequential scanning when said processing means is in its first mode of operation.

21. A receiver as defined in claim 6 wherein said processing means is transferred from said second mode of operation to a third mode of operation in response to actuation of one of said numerical keys, said third mode of operation permitting a frequency to be entered into said display means in response to selective actuation of said numerical keys.

22. A receiver as defined in claim 21 wherein said display frequency is loaded into one of said channel locations of said memory means in response to actuation of a designated function key.

23. A receiver as defined in claim 22 wherein said processing means is adapted to generate an error signal in the event the frequency that is displayed is outside of the bandwidth of said band in response to actuation of said designated function key.

24. A receiver as defined in claim 21 wherein said processing means is transferred to a fourth mode of operation from said third mode of operation in response to actuation of a second designated function key which causes said frequency synthesizing means to generate said initial displayed frequency and to thereafter sequentially generate a predetermined number of successive incremental frequencies and to terminate said sequential generation in the event that said indicating signal is received.

25. A receiver as defined in claim 24 wherein information concerning the frequency of a radio frequency signal that is received while said processing means is operating in said fourth mode is loaded into one of said channel location of said memory means in response to actuation of a preselected function key.

26. A receiver as defined in claim 25 wherein said processing means causes said frequency synthesizing means to increment to the next successive frequency even though said indicating signal is being received, in response to actuation of a preselected function key.

27. A receiver as defined in claim 21 wherein said processing means clears the numbers displayed in said display means while said processing means is operating in said third mode of operation in response to actuation of a preselected function key.

* * * * *